US012796484B2

(12) United States Patent
Furuno

(10) Patent No.: US 12,796,484 B2
(45) Date of Patent: Nov. 10, 2026

(54) LEAD FRAME AND METHOD FOR MANUFACTURING LEAD FRAME

(71) Applicant: Mitsui High-tec, Inc., Fukuoka (JP)

(72) Inventor: Ryota Furuno, Fukuoka (JP)

(73) Assignee: Mitsui High-tec, Inc., Fukuoka (JP)

( * ) Notice: Subject to any disclaimer, the term of this patent is extended or adjusted under 35 U.S.C. 154(b) by 194 days.

(21) Appl. No.: 18/117,140

(22) Filed: Mar. 3, 2023

(65) Prior Publication Data

US 2023/0317570 A1 Oct. 5, 2023

(30) Foreign Application Priority Data

Mar. 10, 2022 (JP) ................................ 2022-037430

(51) Int. Cl.
*H10W 70/40* (2026.01)

(52) U.S. Cl.
CPC ........ *H10W 70/427* (2026.01); *H10W 70/411* (2026.01)

(58) Field of Classification Search
CPC .................... H01L 23/49551; H01L 23/49503
See application file for complete search history.

(56) References Cited

U.S. PATENT DOCUMENTS

2021/0193590 A1* 6/2021 Wang .................. H10W 42/121
2022/0208664 A1* 6/2022 Hayashi ............ H01L 23/49575

FOREIGN PATENT DOCUMENTS

JP 3-295262 A 12/1991
JP 2017147332 A * 8/2017 ......... H01L 21/4821

* cited by examiner

*Primary Examiner* — Sue A Purvis
*Assistant Examiner* — Noor Mohammad Ismail Tahir
(74) *Attorney, Agent, or Firm* — Rankin, Hill & Clark LLP

(57) ABSTRACT

A lead frame including: a die pad; a lead arranged at a periphery of the die pad; and a support bar supporting the die pad, in which the support bar has, at one principal surface thereof, a covered portion covered with needle-like oxide and an exposed portion not covered with the needle-like oxide, and the exposed portion is formed at a bent portion of the support bar inclined with respect to the lead as viewed laterally.

7 Claims, 4 Drawing Sheets

LEAD FRAME AND METHOD FOR MANUFACTURING LEAD FRAME

CROSS-REFERENCE TO RELATED APPLICATION

This application is based on Japanese Patent Application No. 2022-037430 filed with the Japan Patent Office on Mar. 10, 2022, the entire content of which is hereby incorporated by reference.

BACKGROUND

1. Technical Field

An embodiment of the disclosure relates to a lead frame and a method for manufacturing the lead frame.

2. Related Art

A semiconductor device includes, for example, a lead frame, a semiconductor chip mounted thereon, and sealing resin sealing the semiconductor chip. In a process of manufacturing such a semiconductor device, the lead frame and the semiconductor chip mounted thereon are covered with thermosetting resin. Thereafter, the thermosetting resin is heated and cured.

The following technique for improving the reliability of the semiconductor device has been known (see JP-A-3-295262). In this technique, needle-like oxide is formed on a lead frame surface. With this configuration, adhesion between a lead frame and sealing resin is improved.

SUMMARY

A lead frame including: a die pad; a lead arranged at a periphery of the die pad; and a support bar supporting the die pad, in which the support bar has, at one principal surface thereof, a covered portion covered with needle-like oxide and an exposed portion not covered with the needle-like oxide, and the exposed portion is formed at a bent portion of the support bar inclined with respect to the lead as viewed laterally.

DETAILED DESCRIPTION

Figure 1A:
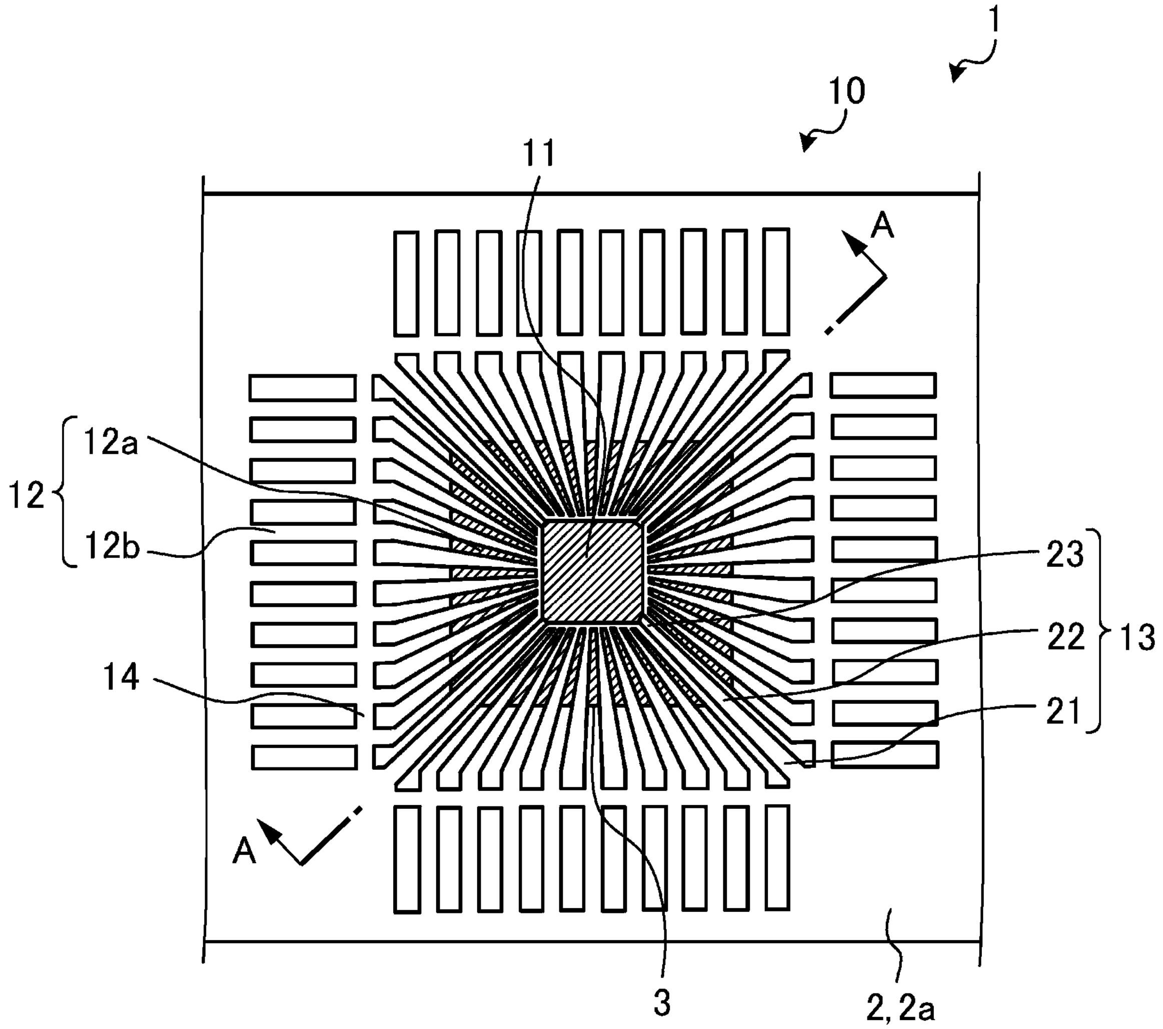
FIG. 1A is a schematic view of a lead frame according to an embodiment.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The following technique has been used for a semiconductor device. In this technique, the height of a die pad and the height of a lead are changed in such a manner that a support bar supporting the die pad is bent. However, in the above-described prior art, when the support bar is bent, needle-like oxide easily adheres to a die or dropped oxide is accumulated on the die. For this reason, the die to which the needle-like oxide adheres or on which the needle-like oxide is accumulated needs to be frequently cleaned. Thus, there is a probability that the productivity of the lead frame is degraded.

One object of one aspect of the embodiment is to provide a lead frame of which the productivity is improved and a method for manufacturing the lead frame.

The lead frame according to one aspect of the embodiment includes a die pad, a lead arranged at the periphery of the die pad, and a support bar supporting the die pad. The support bar has, at one principal surface thereof, a covered portion covered with needle-like oxide and an exposed portion not covered with the needle-like oxide. The exposed portion is formed at a bent portion of the support bar inclined with respect to the lead as viewed laterally.

The method for manufacturing the lead frame according to one aspect of the embodiment includes forming a pattern, forming a covered portion, forming an exposed portion, and bending a support bar. The forming the pattern includes forming, on a metal plate, the pattern including a die pad, a lead arranged at the periphery of the die pad, and the support bar supporting the die pad. The forming the covered portion includes forming, on one principal surface of the support bar, the covered portion covered with needle-like oxide. The forming the exposed portion includes forming the exposed portion by removing part of the covered portion, which is formed on the one principal surface, with laser. The bending the support bar includes bending the support bar such that a portion of the support bar formed with the exposed portion is inclined with respect to the lead as viewed laterally.

According to one aspect of the embodiment, the productivity of the lead frame can be improved.

Hereinafter, a lead frame and a method for manufacturing the lead frame as disclosed in the present application will be described with reference to the attached drawings. Note that an embodiment described below does not limit the technique of the present disclosure.

The drawings are schematic. It should be noted that a dimensional relationship among elements shown in the drawings, a ratio among these elements and the like are different from actual dimensional relationship, ratio and the like in some cases. Further, the drawings are different, in some cases, from each other in the dimensional relationship and ratio among the elements shown in the drawings.

<Lead Frame and Semiconductor Device>

Figure 1B:
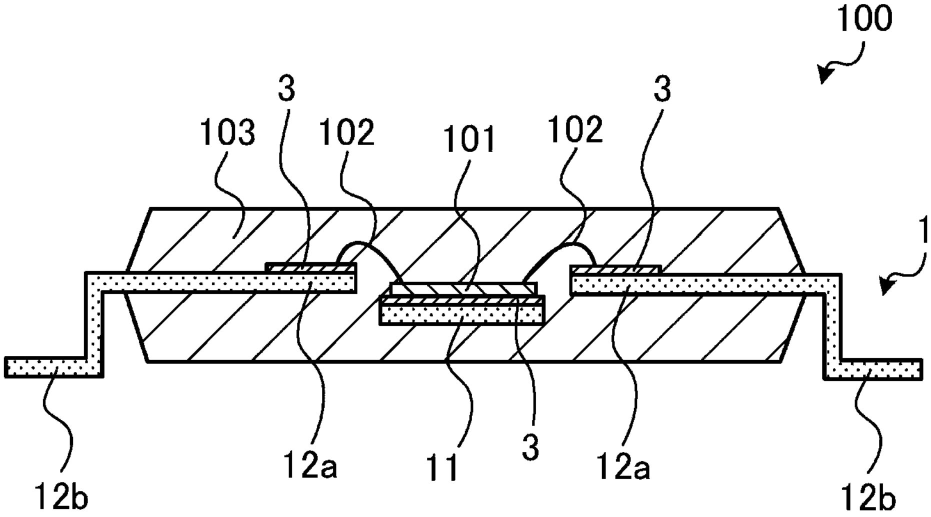
FIG. 1B is a sectional view of a semiconductor device according to the embodiment.

First, a lead frame 1 and a semiconductor device 100 according to the embodiment will be described with reference to FIGS. 1A to 1C. FIG. 1A is a schematic view of the lead frame 1 according to the embodiment. FIG. 1B is a sectional view showing the semiconductor device 100 according to the embodiment.

The lead frame 1 shown in FIG. 1A is a lead frame used for manufacturing a semiconductor device 100 of a quad flat package (QFP) type. Note that the technique of the present disclosure may be applied to lead frames used for manufacturing other types of semiconductor devices, such as a small outline package (SOP) type.

The lead frame 1 according to the embodiment has a band shape as viewed in plane, for example. For example, multiple unit lead frames 10 are formed side by side along a longitudinal direction of the lead frame 1. The unit lead frame 10 is a portion corresponding to one semiconductor device 100 manufacturing using the lead frame 1. Note that the multiple unit lead frames 10 may be formed side by side not only along the longitudinal direction of the lead frame 1, but also a width direction of the lead frame 1.

As shown in FIG. 1A, the unit lead frame 10 has a die pad 11, multiple leads 12, multiple support bars 13, and a dam bar 14. Note that although not shown in FIG. 1A, pilot holes may be provided side by side at a long-side surface of the lead frame 1.

The die pad 11 is provided, for example, at a center portion of the unit lead frame 10. A semiconductor element 101 may be mounted on a front surface side of the die pad 11, as shown in FIG. 1B.

The die pad 11 is coupled to an outer edge portion of the unit lead frame 10 via the multiple support bars 13, and is supported on the unit lead frame 10. These multiple support bars 13 are connected to four corners of the die pad 11, for example.

The multiple leads 12 are arranged side by side at the periphery of the die pad 11. A tip end portion 12*a* of each lead 12 extends from the outer edge portion of the unit lead frame 10 toward the die pad 11. Such a lead 12 functions as a connection terminal of the semiconductor device 100, as shown in FIG. 1B.

The lead 12 has the tip end portion 12*a* and a base end portion 12*b*. As shown in FIG. 1B, in the semiconductor device 100, a bonding wire 102 containing, e.g., Cu, Cu alloy, Au, or Au alloy is connected to the tip end portion 12*a* of the lead 12. Thus, high properties of joint with the bonding wire 102 are required for the lead frame 1. The dam bar 14 connects the adjacent leads 12 to each other.

The semiconductor device 100 has sealing resin 103 in addition to the lead frame 1, the semiconductor element 101, and the bonding wires 102. The sealing resin 103 contains, for example, epoxy resin, and is molded in a predetermined shape by, e.g., a molding process. The sealing resin 103 seals the semiconductor element 101, the bonding wires 102, the surface of the die pad 11, the tip end portions 12*a* of the leads 12, and the like.

The base end portion 12*b* of the lead 12 functions as an external terminal (outer lead) of the semiconductor device 100, and is soldered to a substrate. In a semiconductor device 100 of such a type that a back surface of a die pad 11 is exposed through sealing resin 103 or a semiconductor device 100 of such a type that a heat slug is provided, a back surface of the semiconductor device 100 is soldered to a substrate.

Note that the dam bar 14 has a dam function of reducing leakage of the used resin to a base end portion 12*b* (outer lead) side in a molding process of molding the sealing resin 103. The dam bar 14 is finally cut in a process of manufacturing the semiconductor device 100.

In the lead frame 1 according to the embodiment, a plating layer 3 is formed on the die pad 11 and the tip end portions 12*a* of the leads 12. The plating layer 3 contains Ag (silver) as a main component, for example.

With this configuration, the lead frame 1 and the bonding wire 102 can be easily joined to each other.

Figure 1C:
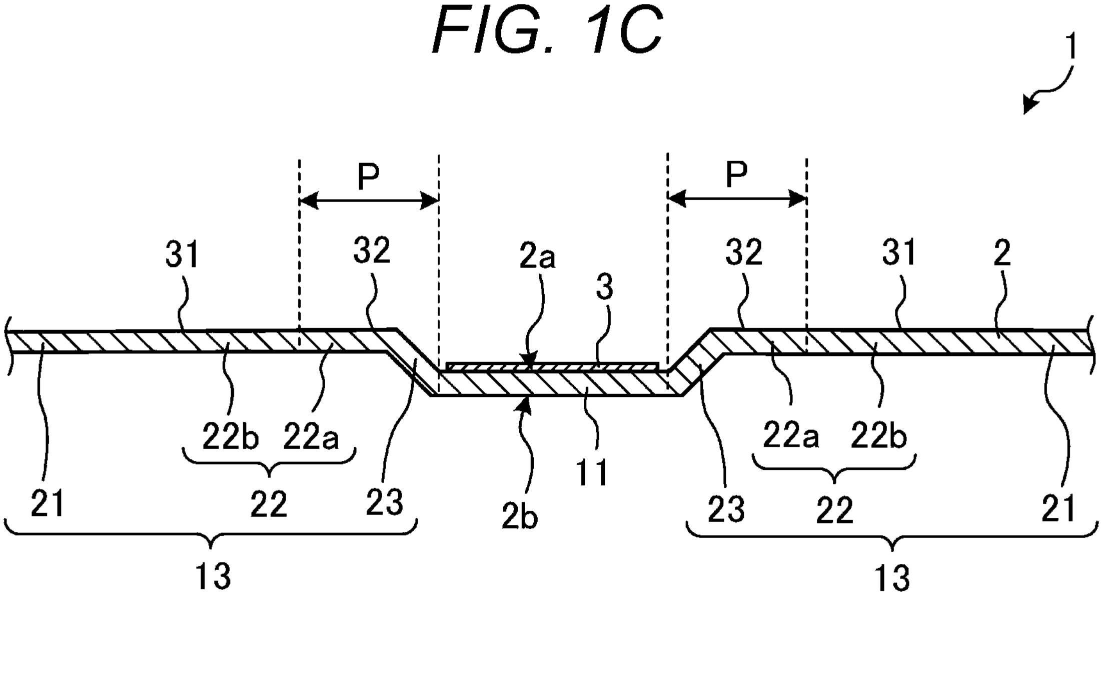
FIG. 1C is a sectional view along an A-A line shown in FIG. 1A.

FIG. 1C is a sectional view along an A-A line shown in FIG. 1A, and shows a sectional structure of the die pad 11 and the support bars 13 in the lead frame 1.

As shown in FIG. 1C, the lead frame 1 according to the embodiment includes a base 2 and the plating layer 3. The base 2 contains a material (e.g., a metal material such as copper or copper alloy) having conductivity. The plating layer 3 is formed on a principal surface 2*a* (one example of one principal surface) of the base 2. The plating layer 3 is, for example, a plating layer containing Ag as a main component.

Note that in order to prevent metal diffusion and improve heat resistance, at least one plating layer containing, e.g., Cu, Ni, Pd, Au, or Ag as a main component may be formed as a foundation plating layer between the base 2 and the plating layer 3. Alternatively, a plating layer containing, e.g., Au, Pt, Pd, or Ag as a main component may be formed on the surface of the plating layer 3.

As shown in FIG. 1C, the support bar 13 has a base end portion 21, a flat portion 22, and a bent portion 23. The base end portion 21 is connected to the outer edge portion of the unit lead frame 10, as shown in FIG. 1A. The flat portion 22 is a flat portion positioned between the base end portion 21 and the bent portion 23 and having the substantially same height as that of the lead 12 (see FIG. 1A).

The bent portion 23 is positioned, for example, at a tip end portion of the support bar 13 or the vicinity thereof. The bent portion 23 is inclined toward a principal surface 2*b* side of the base 2 with respect to the lead 12 (i.e., the flat portion 22). Accordingly, the die pad 11 protrudes to the principal surface 2*b* side of the base 2 with respect to the lead 12.

The support bar 13 according to the embodiment has, at the principal surface 2*a*, an exposed portion 32 at the bent portion 23 and a flat portion 22*a* adjacent to the bent portion 23 on the outside thereof. That is, the support bar 13 has the exposed portion 32 in a region P on a principal surface 2*a* side as shown in FIG. 1C.

On the other hand, the support bar 13 has a covered portion 31 in a region other than the region P on the principal surface 2*a* side as shown in FIG. 1C (e.g., the base end portion 21 and a flat portion 22*b* positioned between the base end portion 21 and the flat portion 22*a*).

Figure 3A:
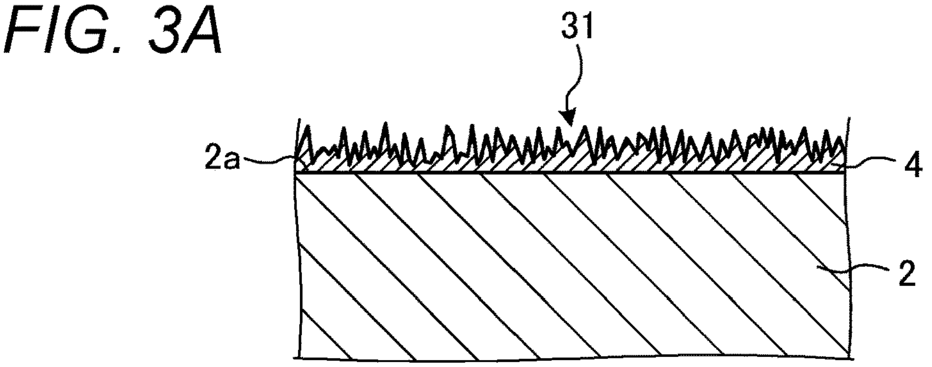
FIG. 3A is a view for describing an oxide formation step according to the embodiment.

The covered portion 31 is a portion of the principal surface 2*a* of the base 2 covered with needle-like oxide 4 (see FIG. 3A). The needle-like oxide 4 is, for example, needle-like copper oxide. The exposed portion 32 is an exposed portion of the principal surface 2*a* of the base 2 not covered with the needle-like oxide 4.

The needle-like oxide 4 is provided on the principal surface 2*a* of the base 2 as described above so that adhesion between the lead frame 1 and the sealing resin 103 (see FIG. 1B) can be improved. Thus, according to the embodiment, the reliability of the semiconductor device 100 can be improved.

Note that in the embodiment, the needle-like oxide 4 may be provided at least at part of a principal surface 2*b* of the base 2. With this configuration, adhesion between the lead frame 1 and the sealing resin 103 can be further improved.

Further, in the embodiment, the exposed portion 32 is formed at the bent portion 23 at the principal surface 2*a* of the support bar 13. That is, in the embodiment, no needle-like oxide 4 is provided on the bent portion 23 on the principal surface 2*a* side.

When the bent portion 23 is formed at the base 2 by pressing of a punch 41 (see FIG. 3C) against the principal surface 2*a*, the needle-like oxide 4 on the bent portion 23 is scraped off by the punch 41. With the above-described configuration, adhesion of the scraped needle-like oxide 4 to the punch 41 can be reduced.

Thus, according to the embodiment, the frequency of a process of cleaning up the needle-like oxide 4 accumulated on the punch 41 can be reduced. Consequently, the productivity of the lead frame 1 can be improved.

In the embodiment, the exposed portion 32 is preferably formed at the flat portion 22*a* adjacent to the bent portion 23 at the principal surface 2*a* of the support bar 13. That is, in the embodiment, no needle-like oxide 4 is preferably provided on the flat portion 22*a* on the principal surface 2*a* side.

When the bent portion 23 is formed at the base 2 with the base 2 supported by a stripper 43 (see FIG. 3C), the needle-like oxide 4 on the flat portion 22*a* contacting the stripper 43 adheres to the stripper 43. With the above-described configuration, such adhesion can be reduced.

Thus, according to the embodiment, the frequency of a process of cleaning up the needle-like oxide 4 accumulated on the stripper 43 can be reduced. Consequently, the productivity of the lead frame 1 can be further improved.

In the embodiment, the exposed portion 32 preferably has a corrugated surface. With this configuration, adhesion between the lead frame 1 and the sealing resin 103 at the exposed portion 32 can be improved. Thus, according to the embodiment, the reliability of the semiconductor device 100 can be improved.

The corrugated surface of the exposed portion 32 can be formed, for example, by heat generated when the exposed portion 32 is formed by removal of the oxide by laser irradiation in a process of manufacturing the lead frame 1 as described below.

<Process of Manufacturing Lead Frame>

Figure 2:
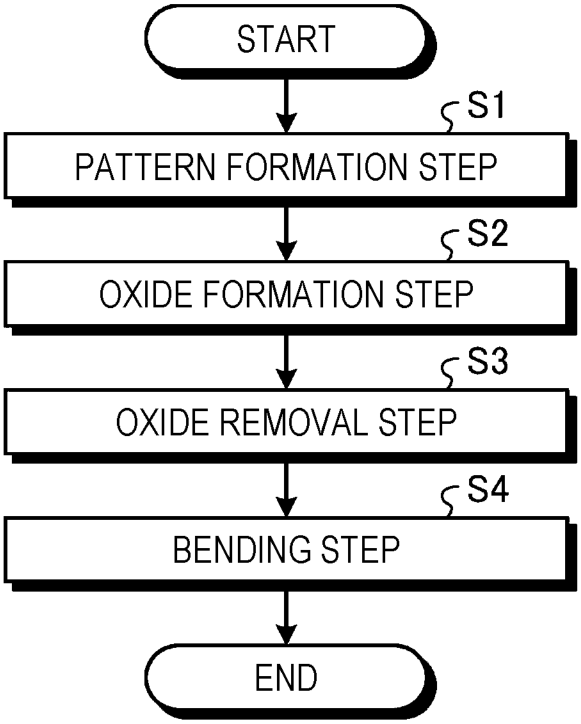
FIG. 2 is a flowchart showing one example of steps of a process of manufacturing the lead frame according to the embodiment.

Subsequently, a process of manufacturing the lead frame 1 according to the embodiment will be described with reference to FIGS. 2 to 3C. FIG. 2 is a flowchart showing one example of steps in a process of manufacturing the lead frame 1 according to the embodiment. Note that regarding the manufacturing process described below, the plating layer 3 is not shown in the figure and description of a step of forming the plating layer 3 is omitted.

As shown in FIG. 2, a pattern including the die pad 11 (see FIG. 1A), the leads 12 (see FIG. 1A), and the support bars 13 (see FIG. 1A) is first formed on a metal plate (pattern formation step) (Step S1). Such a pattern is, for example, a pattern shown in FIG. 1A as viewed in plane.

The pattern formation step may be performed by etching of the metal plate or stamping of the pattern on the metal plate.

Next, an oxide formation step is performed for the metal plate on which the predetermined pattern is formed (Step S2). FIG. 3A is a view for describing the oxide formation step according to the embodiment. As shown in FIG. 3A, in the oxide formation step according to the embodiment, the needle-like oxide 4 is formed on the principal surface 2*a* of the base 2, and in this manner, the covered portion 31 is provided on the principal surface 2*a*.

Such needle-like oxide 4 can be formed, for example, by anode oxidation. Such anode oxidation includes dipping of the base 2 in a strong oxidizing alkali solution, connection of an anode side of a rectifier to the base 2, and connection of a cathode side of a rectifier to an electrode plate arranged in a solution tank. The needle-like oxide 4 formed as described above contains copper (I) oxide ($Cu_2O$) and copper (II) oxide (CuO). Note that the needle-like oxide 4 does not necessarily have a layer structure.

Figure 3B:
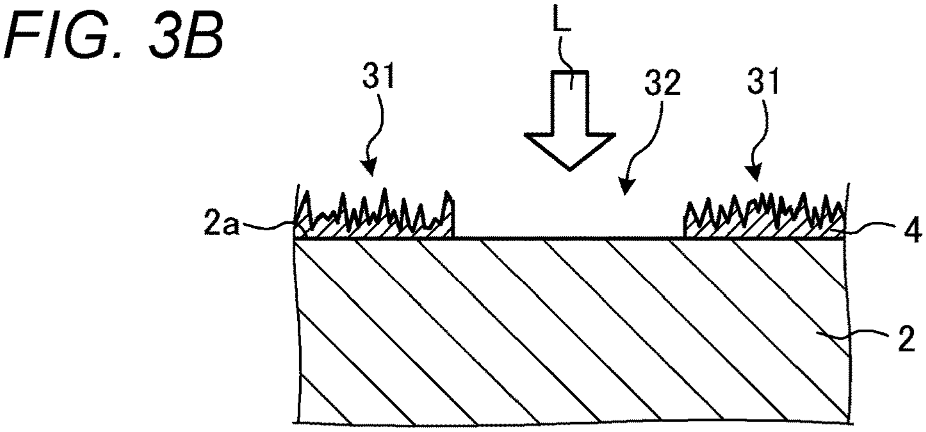
FIG. 3B is a view for describing an oxide removal step according to the embodiment.

Returning to description of FIG. 2, an oxide removal step is performed subsequent to the oxide formation step in a process of manufacturing the lead frame 1 according to the embodiment (Step S3). FIG. 3B is a view for describing the oxide removal step according to the embodiment.

As shown in FIG. 3B, in the oxide removal step according to the embodiment, a predetermined location on the principal surface 2*a* of the base 2 is irradiated with spot-like laser L. Specifically, portions of the principal surface 2*a* of the base 2 corresponding to the bent portions 23 (see FIG. 3C) and portions of the principal surface 2*a* of the base 2 corresponding to the flat portions 22*a* (see FIG. 3C) are irradiated with the spot-like laser L.

Accordingly, as shown in FIG. 3B, the needle-like oxide 4 is removed from the portions corresponding to the bent portions 23 and the portions corresponding to the flat portions 22*a*, and the exposed portions 32 are formed.

In the embodiment, the wavelength of the laser L is preferably within a range of 1000 (nm) to 1100 (nm). The wavelength of the laser L is set within such a range so that the laser L absorption rate of the needle-like oxide 4 can be higher than the laser L absorption rates of Cu which is the main component of the base 2 and Ag which is the main component of the plating layer 3.

Thus, according to the embodiment, the needle-like oxide 4 can be efficiently removed with the laser L. Further, a change in the properties of the portion without the needle-like oxide 4 (e.g., the exposed portion of the base 2 or the portion of the base 2 provided with the plating layer 3) due to the laser L can be reduced.

Note that it has been confirmed that in the embodiment of the present disclosure, the needle-like oxide 4 is removed and the exposed portions 32 are formed at the principal surface 2*a* of the base 2 in such a manner that the needle-like oxide 4 is irradiated with the laser L under the following conditions:

Device: Laser Marker MD-X2500 manufactured by KEYENCE CORPORATION;
Laser Wavelength: 1064 (nm);
Laser Power: 80(%);
Scan Speed: 1000 (mm/s);
Pulse Frequency: 80 (kHz);
Spot Variable: −40;
Number of Times of Printing: 1 (times)
Quality Adjustment Level: Standard;
Type: Fill;
Pattern: Cross;
Direction: Alternate; and
Fill Line Spacing: 0.030 (mm).

Generally, it has been known that a glossy surface of metal (e.g., Cu or Ag) has a lower laser light absorption rate, whereas oxide has a higher laser light absorption rate. Based on such a fact, the inventor(s) of the present application has found as a result of ardent efforts that a preferable laser wavelength range in which the oxide film formed on the lead frame can be removed and there is less influence on the base 2 and the plating layer 3 is 1000 to 1100 (nm).

Returning to description of FIG. 2, a bending step is performed subsequent to the oxide removal step in a process of manufacturing the lead frame 1 according to the embodiment (Step S4). FIG. 3C is a view for describing the bending step according to the embodiment.

Figure 3C:
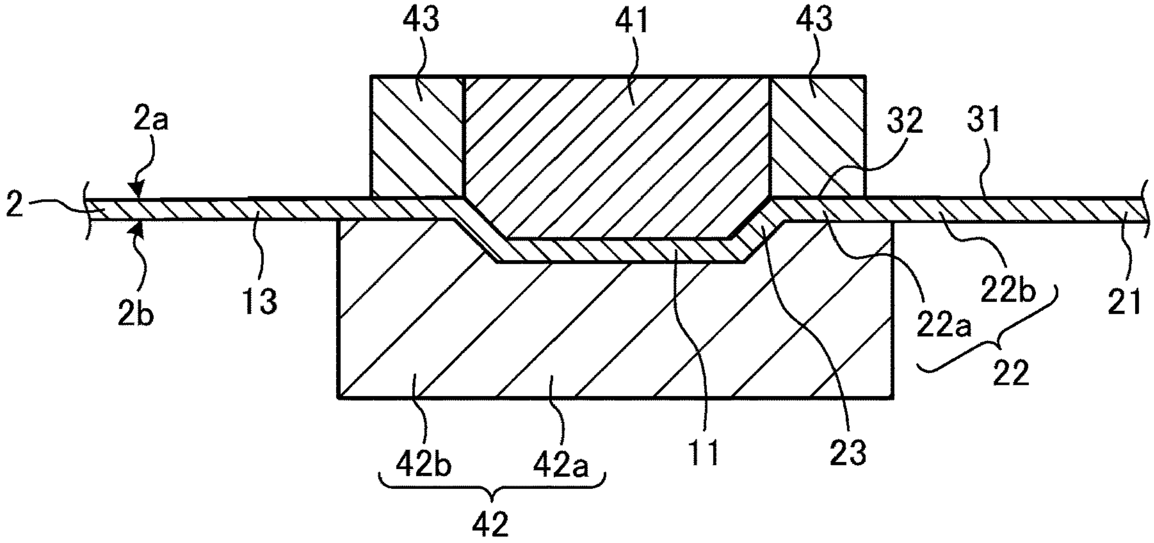
FIG. 3C is a view for describing a bending step according to the embodiment.

As shown in FIG. 3C, the base 2 formed with the exposed portions 32 and the covered portions 31 at the principal surface 2*a* is arranged between the punch 41 and a die plate 42. The die plate 42 is formed with a recessed portion 42*a* which has a complementary shape for the shape of the punch 41.

The punch 41 is inserted into the recessed portion 42*a* of the die plate 42 while pressing the base 2 downward. At this point, the base 2 is fixed with sandwiched between the stripper 43 arranged at the periphery of the punch 41 and an outer peripheral portion 42*b* of the die plate 42 forming the recessed portion 42*a*.

Then, the support bars 13 bend as the punch 41 moves downward, and the die pad 11 of the base 2 protrudes downward and is pressed against a bottom portion of the recessed portion 42*a* of the die plate 42. By such bending, the bent portions 23 are formed at the support bars 13.

Note that instead of downward movement of the punch 41, bending as described above may be performed by upward movement of the die plate 42. Alternatively, bending as described above may be performed by downward movement of the punch 41 and upward movement of the die plate 42.

In the above-described manner, the lead frame 1 having such a shape that the die pad 11 protrudes to the principal surface 2*b* side is obtained, and a process of manufacturing the lead frame 1 according to the embodiment ends.

As described above, in the embodiment, the exposed portion 32 is formed at the portion of the principal surface 2*a* corresponding to the bent portion 23. When the bent portion 23 is formed at the base 2 by pressing of the punch 41 against the principal surface 2*a*, the needle-like oxide 4 on the bent portion 23 is scraped off by the punch 41. With the above-described configuration, adhesion of the scraped needle-like oxide 4 to the punch 41 can be reduced.

Thus, according to the embodiment, the frequency of a process of cleaning up the needle-like oxide 4 accumulated on the punch 41 can be reduced. Consequently, the productivity of the lead frame 1 can be improved.

In the embodiment, the exposed portion 32 is formed at the flat portion 22*a* adjacent to the bent portion 23 at the principal surface 2*a* of the support bar 13. When the bent portion 23 is formed at the base 2 with the base 2 supported by the stripper 43, the needle-like oxide 4 on the flat portion 22*a* contacting the stripper 43 adheres to the stripper 43. With the above-described configuration, such adhesion can be reduced.

Thus, according to the embodiment, the frequency of a process of cleaning up the needle-like oxide 4 accumulated on the stripper 43 can be reduced. Consequently, the productivity of the lead frame 1 can be further improved.

For example, in a case where the oxide removal step is not performed, the productivity of the lead frame 1 is 30(%). On the other hand, the oxide removal step according to the embodiment of the present disclosure is performed so that the productivity of the lead frame 1 can be improved to 82(%).

It has been confirmed that in the embodiment of the present disclosure, there is substantially no change in the heat resistance of the semiconductor device 100 (see FIG. 1B) between the case where the oxide removal step is not performed and the case where the oxide removal step is performed. The above-described heat resistance means the degree of resistance to detachment of the oxide film from the base due to heat caused in a process of assembling the semiconductor device 100, for example.

Moreover, it has been confirmed that in the embodiment of the present disclosure, there is substantially no change in, e.g., the forms of the plating layer 3 and the base 2 when the plating layer 3 and the base 2 are erroneously irradiated with the laser L in both the case where the oxide removal step is not performed and the case where the oxide removal step is performed.

Further, it has been confirmed that in the embodiment of the present disclosure, there is substantially no change in adhesion of the bonding wire 102 (see FIG. 1B) to the plating layer 3 erroneously irradiated with the laser L between the case where the oxide removal step is not performed and the case where the oxide removal step is performed.

The embodiment of the present disclosure has been described above. Note that the technique of the present disclosure is not limited to the above-described embodiment and various changes can be made without departing from the gist of the technique. Note that in the above-described embodiment, the example where the base 2 is exposed at the exposed portion 32 has been described. However, the technique of the present disclosure is not limited to such an example. For example, a substance different from the needle-like oxide 4 may adhere to the exposed portion 32.

In the semiconductor device 100 described above in the embodiment, the principal surface 2*b* side of the die pad 11 is not exposed through the sealing resin 103. On this point, the principal surface 2*b* side of the die pad 11 may be exposed through the sealing resin 103. With this configuration, the heat dissipation of the semiconductor element 101 can be improved.

Note that in this case, no needle-like oxide 4 is preferably provided on the principal surface 2*b* side of the lead frame 1. This is because in a case where the needle-like oxide 4 is provided on the principal surface 2*b* side of the lead frame 1, it is difficult, due to the needle-like oxide 4, to cause a die and the principal surface 2*b* side of the die pad 11 to sufficiently closely contact each other in a sealing process of sealing the die pad 11 or the like in the sealing resin 103. In this case, due to leakage of the sealing resin 103 to the principal surface 2*b* side, it is difficult to sufficiently expose the die pad 11.

As described above, the lead frame 1 according to the embodiment includes the die pad 11, the leads 12 arranged at the periphery of the die pad 11, and the support bars 13 supporting the die pad 11. The support bar 13 has, at one principal surface 2*a* thereof, the covered portion 31 covered with the needle-like oxide 4 and the exposed portion 32 not covered with the needle-like oxide 4. The exposed portion 32 is formed at the bent portion 23 of the support bar 13 inclined with respect to the lead 12 as viewed laterally. With this configuration, the productivity of the lead frame 1 can be improved.

In the lead frame 1 according to the embodiment, the exposed portion 32 is formed at the flat portion 22*a* of the support bar 13 adjacent to the bent portion 23 on the outside thereof. With this configuration, the productivity of the lead frame 1 can be further improved.

In the lead frame 1 according to the embodiment, the exposed portion 32 has the corrugated surface. With this configuration, the reliability of the semiconductor device 100 can be improved.

The method for manufacturing the lead frame 1 according to the embodiment includes the forming the pattern (Step S1), the forming the covered portion 31 (Step S2), the forming the exposed portion 32 (Step S3), and the bending the support bar 13 (Step S4). The forming the pattern (Step S1) includes the forming, on the metal plate, the pattern including the die pad 11, the leads 12 arranged at the periphery of the die pad 11, and the support bars 13 supporting the die pad 11. The forming the covered portion 31 (Step S2) includes the forming, on one principal surface 2*a* of the support bar 13, the covered portion 31 covered with the needle-like oxide 4. The forming the exposed portion 32

(Step S3) includes the forming the exposed portion 32 by removing part of the covered portion 31, which is formed on the one principal surface 2*a*, with the laser L. The bending the support bar 13 (Step S4) includes the bending the support bar 13 such that the portion of the support bar 13 formed with the exposed portion 32 is inclined with respect to the lead 12 as viewed laterally. With this configuration, the productivity of the lead frame 1 can be improved.

In the method for manufacturing the lead frame 1 according to the embodiment, the forming the exposed portion 32 (Step S3) includes the forming the exposed portion 32 at the flat portion 22*a* adjacent to the bent portion 23, which is inclined with respect to the lead 12 as viewed laterally, on the outside thereof. With this configuration, the productivity of the lead frame 1 can be further improved.

In the method for manufacturing the lead frame 1 according to the embodiment, the wavelength of the laser L is within a range of 1000 (nm) to 1100 (nm). With this configuration, the needle-like oxide 4 can be efficiently removed with the laser L. Further, the change in the properties of the portion without the needle-like oxide 4 (e.g., the exposed portion of the base 2 or the portion of the base 2 provided with the plating layer 3) due to the laser L can be reduced.

Further advantageous effects and modifications can be easily derived by those skilled in the art. Thus, a broader scope of the technique of the present disclosure is not limited to the above-described specific details and representative embodiment. Thus, various changes can be made without departing from the general spirit, scope, and concept of the technique defined by the attached claims and equivalents thereof.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:

1. A lead frame comprising:

a die pad;

a lead arranged at a periphery of the die pad; and a support bar supporting the die pad, wherein the support bar has, at one principal surface thereof, a covered portion covered with needle-like copper oxide and an exposed portion not covered with the needle-like copper oxide, the exposed portion is copper, copper alloy or a substance different from the needle-like copper oxide, the exposed portion is formed at a bent portion of the support bar inclined with respect to the lead as viewed laterally, and the exposed portion has a corrugated surface formed by heat generated by laser irradiation.

2. The lead frame according to claim 1, wherein the exposed portion is formed at a flat portion of the support bar adjacent to the bent portion on an outside thereof.

3. The lead frame according to claim 1, wherein the support bar has a base which is the substance different from the needle-like copper oxide, and the one principal surface is of the base, at the covered portion, the one principal surface of the base is covered with the needle-like copper oxide, and at the exposed portion, the one principal surface of the base is exposed and not covered with the needle-like copper oxide.

4. A method for manufacturing a lead frame, comprising:

forming, on a metal plate, a pattern including a die pad, a lead arranged at a periphery of the die pad, and a support bar supporting the die pad;

forming, on one principal surface of the support bar, a covered portion covered with needle-like copper oxide;

forming an exposed portion by removing part of the covered portion, which is formed on the one principal surface, with laser, wherein the exposed portion is copper, copper alloy or a substance different from the needle-like copper oxide; and bending the support bar such that a portion of the support bar formed with the exposed portion is inclined with respect to the lead as viewed laterally, wherein the exposed portion has a corrugated surface formed by heat generated by laser irradiation.

5. The method for manufacturing the lead frame according to claim 4, wherein the forming the exposed portion includes forming the exposed portion at a flat portion adjacent to a bent portion, which is inclined with respect to the lead as viewed laterally, on an outside thereof.

6. The method for manufacturing the lead frame according to claim 4, wherein a wavelength of the laser is within a range of 1000 (nm) to 1100 (nm).

7. The method for manufacturing the lead frame according to claim 5, wherein a wavelength of the laser is within a range of 1000 (nm) to 1100 (nm).

* * * * *